United States Patent

Hwang

[11] Patent Number: 5,843,812
[45] Date of Patent: Dec. 1, 1998

[54] METHOD OF MAKING A PMOSFET IN A SEMICONDUCTOR DEVICE

[75] Inventor: Hyunsang Hwang, Seoul, Rep. of Korea

[73] Assignee: Goldstar Electron Co., Ltd., Chung Cheong Buk-do, Rep. of Korea

[21] Appl. No.: 946,774

[22] Filed: Oct. 8, 1997

Related U.S. Application Data

[60] Continuation of Ser. No. 628,390, Apr. 5, 1996, abandoned, which is a division of Ser. No. 330,481, Oct. 28, 1994, abandoned.

[30] Foreign Application Priority Data

Oct. 28, 1993 [KR] Rep. of Korea ..................... 93-22628

[51] Int. Cl.$^6$ .................................................. H01L 21/336
[52] U.S. Cl. ............................................ 438/197; 438/585
[58] Field of Search ................. 148/DIG. 34, DIG. 112, 148/DIG. 114; 438/197, 585, 775, 791, 922

[56] References Cited

U.S. PATENT DOCUMENTS

| | | | |
|---|---|---|---|
| 4,577,391 | 3/1986 | Hsia et al. | 437/36 |
| 4,621,413 | 11/1986 | Lowe et al. | 437/247 |
| 4,897,360 | 1/1990 | Guckel et al. | 437/247 |
| 5,567,638 | 10/1996 | Lin et al. | 437/242 |

FOREIGN PATENT DOCUMENTS

| | | | |
|---|---|---|---|
| 59-161837 | 9/1984 | Japan | 437/242 |

*Primary Examiner*—Charles L. Bowers, Jr.
*Assistant Examiner*—Taniae M. Thomas
*Attorney, Agent, or Firm*—Loudermilk & Associates

[57] ABSTRACT

An improved p+ polysilicon gated PMOSFET having a channel on the surface of a silicon substrate and improved short channel behavior is disclosed. A simplified process allows making a p+ doped gate and source/drain regions at the same time, the transistor particularly having a stable threshold voltage. The disclosed method provides the steps of: (A) forming an active region and an insulation region on an n-type semiconductor substrate; growing a gate insulating layer on the silicon substrate; depositing a polysilicon layer on the gate insulating layer; annealing the polysilicon layer in the presence of $NH_3$ or other nitrogen-containing gas; (C) forming a gate line by patterning and etching the polysilicon layer; and (D) implanting $BF_2$ ions into the semiconductor substrate.

19 Claims, 1 Drawing Sheet

METHOD OF MAKING A PMOSFET IN A SEMICONDUCTOR DEVICE

This application is a continuation of Ser. No. 08/628,390 filed on Apr. 5, 1996, abandoned, which is a division of Ser. No. 08/330,481, filed Oct. 28, 1994, now abandoned.

FIELD OF THE INVENTION

The present invention relates to methods for making p+ polysilicon-gate PMOS Field Effect Transistors (PMOSFETs) in a semiconductor device, and more particularly to methods including the formation of silicon nitride on grain boundaries of polysilicon for the gate by annealing in an $NH_3$ atmosphere to prevent boron ions from diffusing excessively through a gate silicon oxide layer and into an underlying silicon channel region in a $BF_2$ ion implantation process, resulting in a stable threshold voltage.

BACKGROUND OF THE INVENTION

There is a conventional method of making a PMOSFET, which is shown in IEEE, Vol. 37, No. 8, published in August, 1990, with the PMOSFET formed with a CMOS process which needs a $BF_2$ ion implantation into a source/drain region. $BF_2$ is preferred to boron for the implantation due to its heaviness, enabling an ultra thin source/drain junction to improve the characteristics of the semiconductor device.

A p+ polysilicon gate PMOSFET of a surface channel on a silicon substrate is superior to that of a buried channel in its short channel behavior, and the process may be simplified by implanting $BF_2$ ions to form a source/drain region and a p+ gate simultaneously.

This conventional method of making a PMOSFET includes forming an active area and an insulation area, growing a gate oxide film on a silicon substrate, depositing a polysilicon layer on the gate oxide film, patterning a gate line, forming a source/drain region and a p+ gate at the same time, and forming a contact hole and a metal line.

Cross-sectional views of a PMOSFET formed by the conventional method is illustrated in FIG. 1.

As illustrated in FIG. 1, gate silicon oxide layer 12 is formed on silicon substrate 11 and polysilicon gate 13 is deposited and patterned on gate silicon oxide layer 12. P+ doped source/drain regions and p+ doped gate 13 are formed simultaneously by $BF_2$ ion implantation. Channel C is located between the source and drain regions. Since boron ions penetrate into channel C, these ions function as negative charges, increasing the threshold voltage.

PMOSFET devices which employ n+ doped polysilicon gates typically require a compensating p-type channel implant to lower the magnitude of the negative threshold voltage. Although this results in enhancing the hole mobility in buried-channel structures, submicrometer channel-length devices typically suffer from excessive short channel behavior caused by surface off-current conduction.

As a result, p+ doped polysilicon gates have been proposed for the fabrication of surface-channel PMOS devices which are scalable to deep submicrometer dimensions. Submicrometer PMOS devices fabricated with p+ polysilicon gates offer improved short-channel behavior similar to that of NMOS transistor designs. Several disadvantages of using p+ polysilicon gates in a CMOS process include additional process complexity and a reduction in the low field hole mobility. In addition, the boron used to dope these p+ doped polysilicon gate electrodes can diffuse through the thin gate silicon oxide and into the underlying silicon channel region, causing an instability in the PMOS threshold voltage.

Moreover, previous studies have shown that the threshold voltage shifts due to boron penetration become more severe with an increased annealing temperature and annealing in the presence of hydrogen, and thermal annealing in the presence of fluorine further enhances the boron penetration problem, resulting in PMOS devices with positive voltage shifts, an increase in the electron trapping rate in the gate silicon oxide layer, and an increase in the concentration of negative charges within the underlying silicon channel.

Fluorine is believed to contribute to the boron diffusivity in $SiO_2$, thereby allowing more boron to diffuse into the underlying silicon channel, while reducing the mid gap interface state density to improve the characteristics of the interface between the gate and the gate silicon oxide layer. Although fluorine can be beneficial in phosphorous-doped NMOS polysilicon gates, PMOS devices which employ p+ doped polysilicon gates can exhibit threshold voltage shifts.

SUMMARY OF THE INVENTION

The present invention has as an object the overcoming of the above described disadvantages of the conventional method. It also is an object of the present invention to prevent boron ions from being diffused excessively into a underlying silicon channel region by forming silicon nitride on a grain boundary of polysilicon, resulting in a stable threshold voltage.

Since impurity ions in an ion implantation process mainly diffuse through interfaces among grain boundaries of polycrystalline silicon, excessive diffusion of boron ions and formation of a depletion layer can be controlled effectively by blocking the interfaces with silicon nitride, whereby those ions are diffused uniformly through bulk polycrystalline silicon.

In detail, silicon nitride formed in the presence of ammonia effectively can control excessive diffusion of boron impurities into the underlying silicon channel in that $SixNy$ is formed on the interfaces of grain boundaries of polycrystalline silicon by combining nitrogen out of the ammonia and silicon of the gate to form silicon nitride chemically, changing coefficients of diffusion and segregation.

These and other objects are accomplished in accordance with a method of the present invention, including the steps of: (A) forming a polysilicon layer on a semiconductor substrate; (B) annealing the polysilicon layer in the presence of a gas of a nitrogen compound; and (C) doping boron ions into the polysilicon layer by ion implantation.

More specifically, the present invention may include the steps of: (A) forming an active region and an insulation region on an n-type semiconductor substrate, and growing a gate insulating layer on the semiconductor substrate; (B) depositing a polysilicon layer on the gate insulating layer to form a gate line, and annealing the polysilicon layer in the presence of $NH_3$; (C) forming the gate line by patterning and etching the polysilicon layer; and (D) implanting $BF_2$ ions into the semiconductor substrate.

Furthermore, the present invention in a different way may include the steps of: (A) forming an active region and an insulation region on an n-type semiconductor substrate, and growing a gate insulating layer on the semiconductor substrate; (B) depositing a polysilicon layer on the gate insulating layer to form a gate line, and forming the gate line by patterning and etching the polysilicon layer anisotropically; (C) annealing the polysilicon layer in the presence of $NH_3$; and (D) implanting $BF_2$ ions into the semiconductor substrate.

Additionally, a method of making a PMOSFET in a semiconductor device according to the present invention may include the steps of: (A) forming a gate insulating layer on an n-type semiconductor substrate; (B) depositing a polysilicon layer on the gate insulating layer to form a gate line, and annealing the polysilicon layer in the presence of a gas of a nitrogen compound; (C) forming a gate electrode by patterning and etching the polysilicon layer; and (D) implanting impurity ions into the semiconductor substrate.

BRIEF DESCRIPTION OF THE DRAWINGS

The above objects and other advantages of the present invention will be more apparent by describing in detail the preferred embodiments of the present invention with reference to the attached drawings.

DESCRIPTION OF THE PREFERRED EMBODIMENTS

Figure 1:
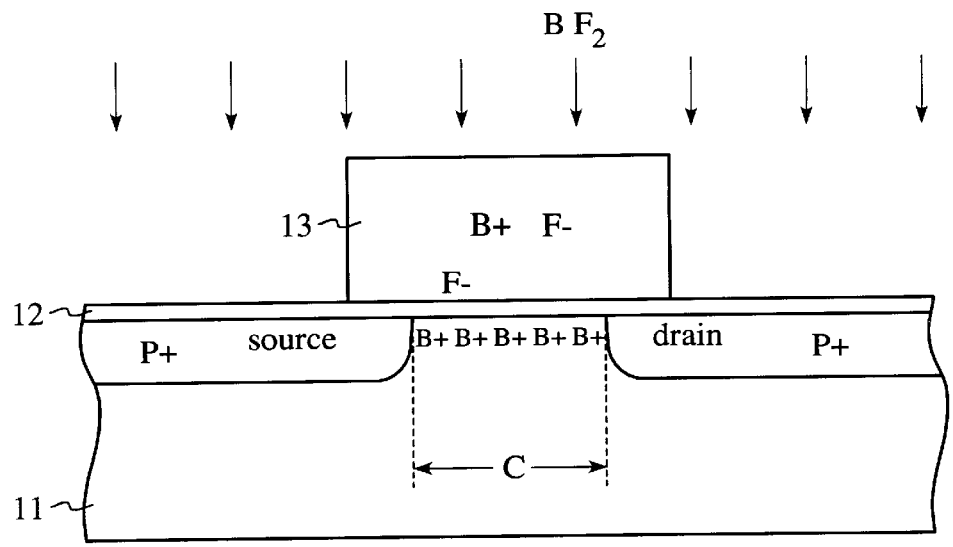
FIG. 1 illustrates a cross-sectional view of a PMOSFET in a semiconductor device fabricated by a conventional method.

The present invention is a method of making a PMOSFET in a semiconductor device, particularly a PMOSFET having a p+ doped gate.

Although not explicitly shown in the drawings, it is well know to form an active region and an insulation region on an n-type silicon substrate, and thereafter a gate silicon oxide film is grown on the silicon substrate. A polysilicon layer is deposited on the gate silicon oxide film to form a gate line.

In the presence of $NH_3$ (or other suitable nitrogen compound-containing gas), the polysilicon layer is annealed at a temperature in the range of about 700° to 1000° C. and for a time ranging from seconds to minutes.

As the deposited polysilicon has various crystal structures, each structure forms a grain, whereby grain boundaries adjoin one another so that dopants pass through interfaces of the polysilicon grains. Nitrogen out of the ammonia passes through the grain boundaries, reacting with silicon of the grains to form silicon nitride.

Since the silicon nitride fills and blocks the grain boundaries, boron is limited to diffuse uniformly through bulk polycrystalline silicon, and formation of a depletion layer can be prevented.

After the silicon nitride is formed on the grain boundaries, a gate line is formed by patterning and etching anisotropically the polysilicon layer.

A p+ doped gate and source/drain regions are formed at the same time by $BF_2$ ion implantation and annealing for a sufficient diffusion of impurity ions.

In the conventional method, boron ions diffuse rapidly through the grain boundaries and penetrate into the underlying silicon channel in the silicon substrate, causing an unstable threshold voltage.

In the present invention, however, boron ions are diffused more uniformly through bulk polysilicon, resulting in a more stable threshold voltage.

Figure 2A:
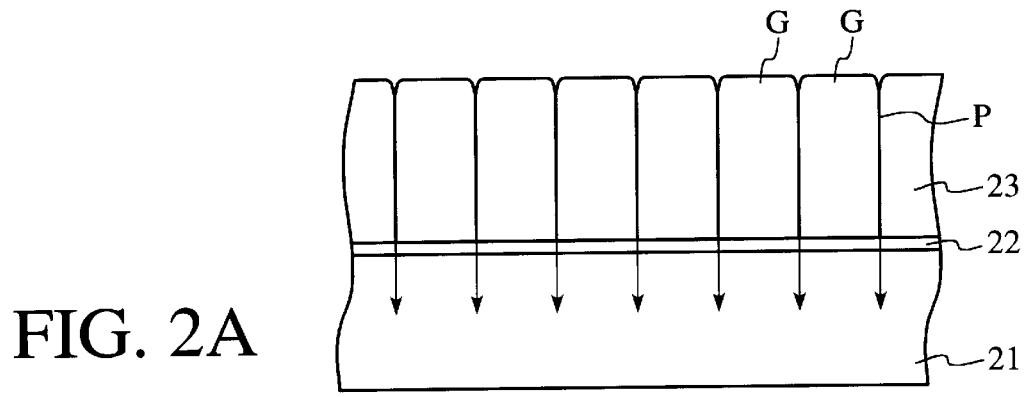
FIGS. 2A and 2B illustrate detailed cross-sectional views of PMOSFET gate diffusion paths of dopants according to the conventional method and according to the present invention, respectively.

FIG. 2A illustrates diffusion paths of boron ions according to the conventional method of doping polysilicon in a semiconductor device.

Polycrystalline silicon layer 23 is deposited on gate silicon oxide layer 22, which is formed on n-type silicon substrate 21.

Polysilicon layer 23 consists of grains G, of which boundaries become paths P for diffusing ions.

Hence, boron ions pass through paths P, penetrate into gate silicon oxide 22, and then diffuse into underlying silicon substrate 21.

Figure 2B:
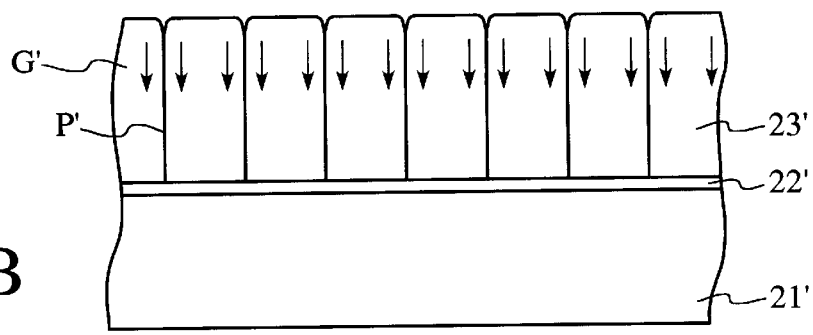

FIG. 2B illustrates a diffusion path of boron ions for doping polysilicon in a semiconductor device according to the present invention.

Polycrystalline silicon layer 23' is deposited on gate silicon oxide layer 22', which is formed on n-type silicon substrate 21'.

Polysilicon layer 23' consists of grains G, of which boundaries become paths P' for formation of silicon nitride. Since paths P' are blocked with silicon nitride formed by thermal treatment in the presence of $NH_3$, boron ions are no longer able to use paths P' as paths for diffusion. Subsequently, boron ions diffuse through a bulk of polysilicon layer 23'.

Consequently, the penetration of ion impurities through grain boundaries is inhibited, resulting in a stabilized threshold voltage.

In accordance with the method as described above, the present invention provides improved short channel behavior by making a p+ polysilicon gated PMOSFET which has a channel on the surface of a silicon substrate, a simplified process by making a p+ doped gate and source/drain regions at the same time, and particularly the threshold voltage that is stable.

Although various preferred embodiments of the present invention have been disclosed for illustrative purposes, those skilled in the art will appreciate that various modifications, additions and/or substitutions are possible without departing from the scope and spirit of the present invention as defined in the claims.

What is claimed is:

1. A method of forming a doped polysilicon layer in a semiconductor device, comprising the steps of:
   (A) forming a polysilicon layer having grain boundaries on a semiconductor substrate;
   (B) annealing the polysilicon layer in the presence of $NH_3$, wherein the annealing is conducted under conditions wherein a silicon-nitrogen material is formed at the grain boundaries of the polysilicon layer; and
   (C) doping boron ions into the polysilicon layer by ion implantation, wherein the silicon-nitrogen material formed at the grain boundaries inhibits diffusion of the boron ions along the grain boundaries.

2. The method of claim 1, wherein annealing step (B) further comprises the steps of patterning and etching anisotropically the polysilicon layer.

3. The method of claim 1, wherein doping step (C) further comprises the step of annealing the polysilicon layer.

4. The method of claim 1, wherein the boron ions comprise $BF_2$ ions.

5. The method of claim 1, wherein the nitrogen compound of step (B) comprises $NH_3$.

6. A method of manufacturing a PMOSFET in a semiconductor device, comprising the steps of:
   (A) forming an active region and an insulation region on an n-type semiconductor substrate, and forming a gate insulating layer on the semiconductor substrate;
   (B) depositing a polysilicon layer having grain boundaries on the gate insulating layer, and annealing the polysilicon layer in the presence of $NH_3$, wherein the annealing is conducted under conditions wherein a silicon-nitrogen material is formed at the grain boundaries of the polysilicon layer;

(C) forming a gate line by patterning and etching the polysilicon layer; and (D) implanting boron ions comprising $BF_2$ ions into the semiconductor substrate, wherein the silicon-nitrogen material formed at the grain boundaries inhibits diffusion of the boron ions along the grain boundaries.

7. The method of claim 6, wherein the implanting step further comprises the step of annealing, wherein impurity ions diffuse into the semiconductor substrate.

8. The method of claim 6, wherein the $BF_2$ ions are implanted into the gate and into the active region to form source and drain regions.

9. The method of claim 6, wherein the gate insulating layer comprises silicon oxide.

10. A method of manufacturing a PMOSFET in a semiconductor device, comprising the steps of:

(A) forming an active region and an insulation region on an n-type semiconductor substrate, and growing a gate insulating layer on the semiconductor substrate:

(B) depositing a polysilicon layer having grain boundaries on the gate insulating layer, and forming a gate line by patterning the polysilicon layer;

(C) annealing the polysilicon layer in the presence of $NH_3$, wherein the annealing is conducted under conditions wherein a silicon-nitrogen material is formed at the grain boundaries of the polysilicon layer; and (D) implanting boron ions comprising $BF_2$ ions into a surface of the semiconductor substrate, wherein the silicon-nitrogen material formed at the grain boundaries inhibits diffusion of the boron ions along the grain boundaries.

11. The method of claim 10, wherein the implanting step further comprises the step of annealing, wherein the impurity ions diffuse into the semiconductor substrate.

12. A method of manufacturing a PMOSFET in a semiconductor device, comprising the steps of:

(A) forming a gate insulating layer on an n-type semiconductor substrate;

(B) depositing a polysilicon layer having grain boundaries on the gate insulating layer, and annealing the polysilicon layer in the presence of $NH_3$, wherein the annealing is conducted under conditions wherein a silicon-nitrogen material is formed at the grain boundaries of the polysilicon layer;

(C) forming a gate electrode by patterning the polysilicon layer; and (D) implanting impurity ions into the semiconductor substrate, wherein the silicon-nitrogen material formed at the grain boundaries inhibits diffusion of the boron ions along the grain boundaries.

13. The method of claim 12, wherein the impurity ions comprise $BF_2$ ions.

14. The method of claim 12, wherein the gas containing a nitrogen compound comprises $NH_3$.

15. The method of claim 12, wherein the implanting step further comprises the step of annealing, wherein the impurity ions diffuse into the semiconductor substrate.

16. The method of claim 1, wherein annealing step (B) is carried out in a temperature range of about 700° to 1000° C.

17. The method of claim 6, wherein the annealing step is carried out in a temperature range of about 700° to 1000° C.

18. The method of claim 10, wherein the annealing step is carried out in a temperature range of about 700° to 1000° C.

19. The method of claim 12, wherein the annealing step is carried out in a temperature range of about 700° to 1000° C.

* * * * *